(12) United States Patent
Oka (10) Patent No.: US 10,153,413 B2
(45) Date of Patent: Dec. 11, 2018

(54) LIGHT-EMITTING DEVICE

(71) Applicant: NICHIA CORPORATION, Anan-shi (JP)

(72) Inventor: Yuta Oka, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/281,078

(22) Filed: Sep. 30, 2016

(65) Prior Publication Data

US 2017/0092826 A1 Mar. 30, 2017

(30) Foreign Application Priority Data

Sep. 30, 2015 (JP) ................. 2015-194952

(51) Int. Cl.
| | |
|---|---|
| *H01L 33/60* | (2010.01) |
| *H01L 33/50* | (2010.01) |
| *H01L 33/56* | (2010.01) |
| *H01L 33/62* | (2010.01) |
| *H01L 33/46* | (2010.01) |

(52) U.S. Cl.
CPC ............ *H01L 33/60* (2013.01); *H01L 33/507* (2013.01); *H01L 33/56* (2013.01); *H01L 33/62* (2013.01); *H01L 33/46* (2013.01); *H01L 33/50* (2013.01); *H01L 2224/16245* (2013.01); *H01L 2224/48091* (2013.01); *H01L 2224/48247* (2013.01); *H01L 2224/48257* (2013.01); *H01L 2224/73265* (2013.01); *H01L 2224/8592* (2013.01)

(58) Field of Classification Search
CPC ....... H01L 33/60; H01L 33/507; H01L 33/56; H01L 33/66
See application file for complete search history.

(56) References Cited

U.S. PATENT DOCUMENTS

| | | | | |
|---|---|---|---|---|
| 2002/0171911 | A1* | 11/2002 | Maegawa | H01L 33/50 359/308 |
| 2006/0034084 | A1* | 2/2006 | Matsuura | H01L 33/507 362/293 |
| 2007/0290329 | A1* | 12/2007 | Murayama | H01L 23/147 257/704 |
| 2008/0037252 | A1* | 2/2008 | Nii | H01L 33/60 362/267 |
| 2012/0193666 | A1* | 8/2012 | Namiki | C09J 163/00 257/98 |
| 2014/0284557 | A1* | 9/2014 | Choi | H01L 51/5268 257/40 |

(Continued)

FOREIGN PATENT DOCUMENTS

| | | |
|---|---|---|
| JP | 2008-300621 | 12/2008 |
| JP | 2011-057917 | 3/2011 |
| JP | 2014-158011 | 8/2014 |

*Primary Examiner* — Kyoung Lee
*Assistant Examiner* — Christina Sylvia
(74) *Attorney, Agent, or Firm* — Mori & Ward, LLP (57) ABSTRACT

A light-emitting device includes a base, a light-emitting element, and reflecting elements. The light-emitting element is mounted on the base. The reflecting elements are arranged around the light-emitting element to reflect light emitted by the light-emitting element. Each of the reflecting elements includes a core and a dielectric multilayer film. The dielectric multilayer film covers the core and has a thickness to reflect a wavelength of the light emitted by the light-emitting element.

12 Claims, 3 Drawing Sheets

(56) References Cited

U.S. PATENT DOCUMENTS

| | | | |
|---|---|---|---|
| 2015/0221623 A1* | 8/2015 | Tischler | H01L 25/165 257/89 |
| 2016/0027971 A1* | 1/2016 | Anc | C09K 11/025 257/98 |
| 2016/0218252 A1* | 7/2016 | Steckel | H01L 33/56 |

* cited by examiner

LIGHT-EMITTING DEVICE

CROSS-REFERENCE TO RELATED APPLICATION

This application claims priority to Japanese Patent Application No. 2015-194952, filed on Sep. 30, 2015. The contents of this application are incorporated herein by reference in their entirety.

BACKGROUND

1. Field of the Invention

The present invention relates to a light-emitting device.

2. Description of Related Art

In recent years, as for lighting fixtures for general lighting, the utilization of light-emitting diodes (hereinafter may be referred to as "LED") of lower power consumption has been developing, in place of conventional incandescent bulbs, and the fields of its application have been expanding into various fields, which are exemplified by uses of backlights, lighting, and vehicles. In particular, LEDs in which nitride based semiconductors are used have a wide band gap and can emit light of which the wavelength is short, so that the utilization of the LEDs has been developing in recent years.

The aforementioned light-emitting devices generally have a structure in which a light-emitting element such as an LED is mounted in a cavity of a package, which may be made of a resin material, so as to extract light to the outside. In such a structure, in order to improve its light extraction efficiency, a coating of a metal may be applied in the cavity of the package made of a resin material to increase the reflectance. For a metal material, metal having high reflectance, for example, Ag is used.

On the other hand, Ag may be discolored due to sulfurization, which may result in a decrease in the reflectivity, which may lead to the use of a dielectric multilayer film (e.g., distributed Bragg reflector: DBR) for the coating in the cavity in place of such a metal film (e.g., Japanese Unexamined Patent Application Publication No. 2008-300621).

SUMMARY

According to one aspect of the present disclosure, a light-emitting device includes a base, a light-emitting element, and reflecting elements. The light-emitting element is mounted on the base. The reflecting elements are arranged around the light-emitting element to reflect light emitted by the light-emitting element. Each of the reflecting elements includes a core and a dielectric multilayer film. The dielectric multilayer film covers the core and has a thickness to reflect a wavelength of the light emitted by the light-emitting element.

BRIEF DESCRIPTION OF THE DRAWINGS

A more complete appreciation of the invention and many of the attendant advantages thereof will be readily obtained as the same becomes better understood by reference to the following detailed description when considered in connection with the following accompanying drawings.

DESCRIPTION OF EMBODIMENTS

The embodiment(s) will now be described with reference to the accompanying drawings, wherein like reference numerals designate corresponding or identical elements throughout the various drawings.

First Embodiment

A light-emitting device 100 according to a first embodiment of the present invention will be described based on a cross-sectional view in FIG. 1. The light-emitting device 100 illustrated in FIG. 1 includes a base 10, a light-emitting element 20, and reflecting elements 30. The light-emitting element 20 is mounted on the base 10. The base 10 includes an opening formed in a recessed shape in a cross-sectional view, and the light-emitting element 20 is mounted on a bottom surface of the opening.

Base 10

The base 10 is made of, for example, resin and covers metal leads. Upper surfaces of the leads are exposed on the bottom surface of the opening, and the light-emitting element 20 is mounted on the upper surface of one of the leads via a bonding member. In the present embodiment, the leads include a first lead 11 and a second lead 12. The first lead 11 and the second lead 12 are separated apart from each other and covered by the resin, and the leads are respectively connected to the positive and negative electrodes of the light-emitting element 20. In the example shown in FIG. 1, the light-emitting element 20 is mounted on the first lead 11 with the electrodes face upward, and the electrodes are connected to the first lead 11 and the second lead 12 respectively, by wires 24. The leads are made of a material having good electroconductivity. Also, in the example shown in FIG. 1, surfaces that surround the mounting area of the light-emitting element 20 in the opening are inclined. In order to form such inclined surfaces, lateral walls 13, surrounding the mounting area may be formed on the plate-shape base with the use of resin. Also, the base can be integrally formed with the lateral walls and the leads being covered by the resin. Also, the leads can be formed in a recessed shape so that the inclined surfaces can be formed with the leads.

Examples of resin materials of the base 10 include, thermoplastic resin such as aliphatic polyamide resin, semi-aromatic polyamide resin, polyethylene terephthalate, polycyclohexane terephthalate, unsaturated polyester resin, liquid crystal polymer, polycarbonate resin, syndiotactic polystyrene, polyphenylene ether, polyphenylene sulfide, polyether sulfone resin, polyether-ketone resin, and polyarylate resin, and thermosetting resin such as epoxy resin, epoxy modified resin, silicone resin, silicone modified resin, polybismaleimide-triazine resin, polyimide resin, and polyurethane resin. Also, the resin materials can contain particles or fibers of fillers or color pigments such as glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chromium oxide, manganese oxide, or carbon.

The base 10 may be made of metal having ceramics or insulation layers.

Examples of ceramic materials include alumina, aluminum nitride, and mullite.

Light-emitting Element 20

The light-emitting element 20 mainly includes a semiconductor layered structure whose planar shape is quadrangle, a first electrode layer (e.g., a p-side electrode) and a second electrode layer (e.g., an n-side electrode) provided on the same surface side of the semiconductor layered structure. The semiconductor layered structure includes a first conductive semiconductor layer (e.g., an n-type semiconductor layer) and a second conductive semiconductor layer (e.g., a p-type semiconductor layer). It is preferable that an active layer is included between the first conductive semiconductor layer and the second conductive semiconductor layer. The types and materials of the first conductive semiconductor layer, the active layer, and the second conductive semiconductor layer are appropriately selected, and for example, semiconductor materials such as $In_XAl_YGa_{1-X-Y}N$, ($0 \leq X$, $0 \leq Y$, $X+Y<1$) can be employed. The thickness and layer structure known in the art can be applied to the structure of each layer. In this example, only one light-emitting element 20 is mounted, but the scope of the present invention is not limited to the aforementioned structure, and a plurality of light-emitting elements can be mounted in one opening. A plurality of openings may be provided on the base. The planar shape of the semiconductor layered structure may be a rectangular shape or a polygon such as a hexagon.

Protective Element 22

A protective element 22 may be additionally installed in the light-emitting device. The protective element 22 is electrically connected to the light-emitting element 20 and serves as a member for electrically protecting the light-emitting element 20. In the case where a reverse voltage is applied due to, for example, static electricity, the light-emitting element 20 is prevented from being damaged. For the protective element 22, a Zener diode electrically connected in parallel in a reverse direction with respect to the conduction direction of the light-emitting element 20 is preferably employed. Alternatively, a varistor may be employed. The protective element may be flip-chip mounted (mounted in a flip-chip manner) or electrically connected with a wire.

Lead

The first lead 11 and the second lead 12 are preferably formed of a metal plate (e.g., a Cu plate). Plating (e.g., Ag plating) may be applied to the surface of the leads as needed so as to improve the reflectivity or conductivity. In the example shown in FIG. 1, parts of the upper surfaces of the first lead 11 and the second lead 12 are exposed on the bottom surface of the opening. The leads are formed such that the exposed upper surfaces of the first lead 11 and the second lead 12 are approximately flush with the upper surface of the resin filled therebetween. Bottom surfaces of the first lead 11 and the second lead 12 are partially exposed on a bottom surface of the base 10, and covered with the resin in such a manner as to be flush with a bottom surface of the resin. Thus, the leads are exposed on the back surface side of the base 10, and an external heat dissipation member such as a heat sink can be thermally coupled to the back surface side of the base 10. Thereby, performance of heat dissipation is improved by allowing heat to be dissipated at a position close to the light-emitting element 20.

Figure 1:
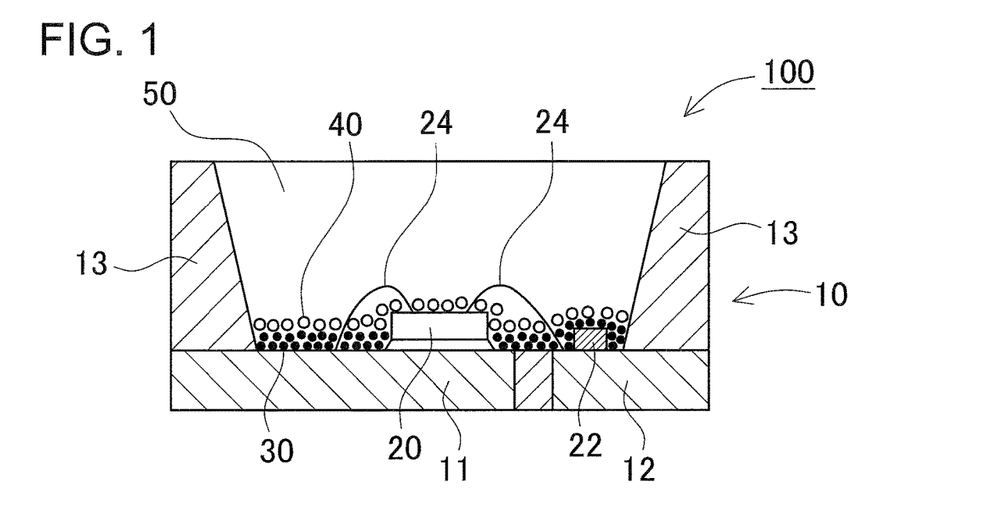
FIG. 1 is a schematic cross-sectional view of a light-emitting device according to a first embodiment of the present invention.

In the example shown in FIG. 1, the light-emitting element 20 is mounted on the first lead 11, which is a metal plate, but the upper surface of the first lead 11 and a lower surface of the light-emitting element 20 are electrically isolated on the mounting portion. The first lead 11 is electrically connected to the electrode formed on the upper surface of the light-emitting element 20 with the wire 24. Also, the first lead 11 has structure with which heat generated by the light-emitting element 20 is easily dissipated. Specifically, the first lead 11 is constituted of, or coated with a metal material that has good thermal conductivity.

Reflecting Element 30

The reflecting element 30 is configured to reflect the light emitted by the light-emitting element 20. Reflecting elements 30 are arranged around the light-emitting element 20. The reflecting element 30 has a fine particle, and light emitted by the light-emitting element 20 is reflected by the reflecting elements 30, which makes it possible to efficiently extract the light from the base 10 to the outside.

Figure 2:
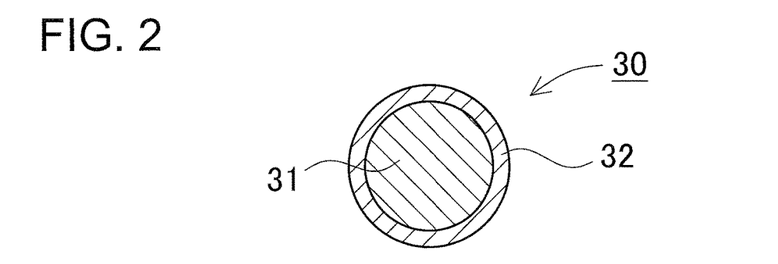
FIG. 2 is a schematic cross-sectional view of a reflecting element.

As illustrated in a cross-sectional view in FIG. 2, the reflecting element 30 is formed of a core 31 and a dielectric multilayer film 32 that covers the core 31. The thickness of the dielectric multilayer film 32 is set so as to reflect the wavelength of the light emitted by the light-emitting element 20. Typically, a distributed Bragg reflector (e.g., Distributed Bragg Reflector: DBR) can be employed for the dielectric multilayer film 32. Also, materials known in the art can be employed for the dielectric multilayer film 32. The dielectric multilayer film 32 is preferably formed of at least two types or more of layers made of materials selected from a group made of, $SiO_2$, $TiO_2$, $Nb_2O_5$, $ZrO_2$, $Al_2O_3$, $Ta_2O_5$, $MgF_2$, AlN, SiON, and SiN. Also, it is preferable that the thickness of the dielectric multilayer film 32 be approximately uniform. In this specification, being approximately uniform in terms of the thickness of the dielectric multilayer film means a state where the distribution of the thicknesses is in a range of plus or minus 10 percent of an average value. Also, in this specification, the reflecting element 30 is a member that have a function of reflecting the light and means member that reflect 80 percent or more of light of which the wavelength is designed. For a method for forming the dielectric multilayer film 32 on the core 31, for example, an atomic layer deposition method (Atomic Layer Deposition: ALD) can be employed.

Metal materials can be preferably employed for the core 31 of the reflecting element 30. The reflecting element 30 can be of good heat dissipation by use of the core 31 made of the metal material. Examples of materials of the core 31 include any of Cu, Ag, and Al.

The reflecting element 30 is formed of a particle. The reflecting element 30 is preferably formed in a spherical shape. However, it is unnecessary to form a spherical, perfect circle, but ellipsoid or polyhedron having polygonal surfaces may be applied, or the surface of the reflecting element 30 may include partial depressions or projections. Thus, "particle" in this specification means ones in any shape, and not only the spherical shape.

As described above, the reflecting element 30 is a particle, and a multitude of the reflecting elements 30 are arranged in the around of the light-emitting element 20. Accordingly, the reflecting elements 30 can be easily arranged only in a desired area without being limited to the peripheral shape of the light-emitting element 20, compared with conventional structure in which reflection layers are formed in a film form in the around of the light-emitting element 20. That is, generally, the steps of forming films are repeatedly performed a plurality of times on a flat region having an area to some extent, so as to form the reflection layers of the dielectric multilayer film in a layered structure. In this method, the films are formed in a wide range inclusive of unnecessary areas, and therefore it is not always easy to form the films only in a desired area. For example, in the case where the reflection layer is provided on the light-emitting device in which the light-emitting element is mounted on the base, the reflection layer needs to be formed prior to the mounting of the light-emitting element. In the case where the reflection layer is provided on the upper surface of the light-emitting element, the light output from the upper surface is reduced, which leads to reduction in the heat dissipation of the light-emitting element. However, in this method, the reflection layer is formed in the unnecessary areas, which is a waste. Accordingly, the reflecting element 30 covered with the dielectric multilayer film 32 is formed in a particle in advance, not in a film form and arranged in such a manner as to spread all over a desired area, so that the reflection area can be more flexibly and efficiently formed. There is an advantage of using the reflective elements in that the reflection layer can be in a shape to follow an irregular surface, and the reflection area can be easily formed even on a surface having depressions and projections. For example, as illustrated in FIG. 1, the reflecting elements 30 can be arranged in such a manner as to cover the upper surface of the protective element 22 in a state where the protective element 22 is mounted on one of the leads.

The reflecting elements 30 may be fixed on the base 10 with an adhesive material such as a binder. For the adhesive material, resin that can be used for a sealing member 50 described later, can be preferably utilized. For example, the reflecting elements are applied at a desired position on the base in a state where the reflecting elements are mixed into the binder having adhesive properties in advance, or the adhesive material is applied from the upper surface of the reflecting elements in a state where the reflecting elements are arranged at a desired position on the base in advance, thereby fixing the reflecting element.

Sealing Member 50

Also, the reflecting elements 30 may be fixed with the sealing member 50. In this case, the sealing member 50 only needs to be formed in such a manner as to cover the reflecting elements 30 after the reflecting elements 30 are arranged.

Resin that has light transmissivity and is in good weather resistance can be preferably utilized for the sealing member 50. Examples of resin for the sealing member 50 include at least one type of resin selected from polyolefin resin, polycarbonate resin, polystyrene resin, epoxy resin, acrylic resin, acrylate resin, methacrylic resin (i.e., PMMA), urethane resin, polyimide resin, polynorbornene resin, fluororesin, silicone resin, silicone modified resin, and epoxy modified resin.

Figure 3:
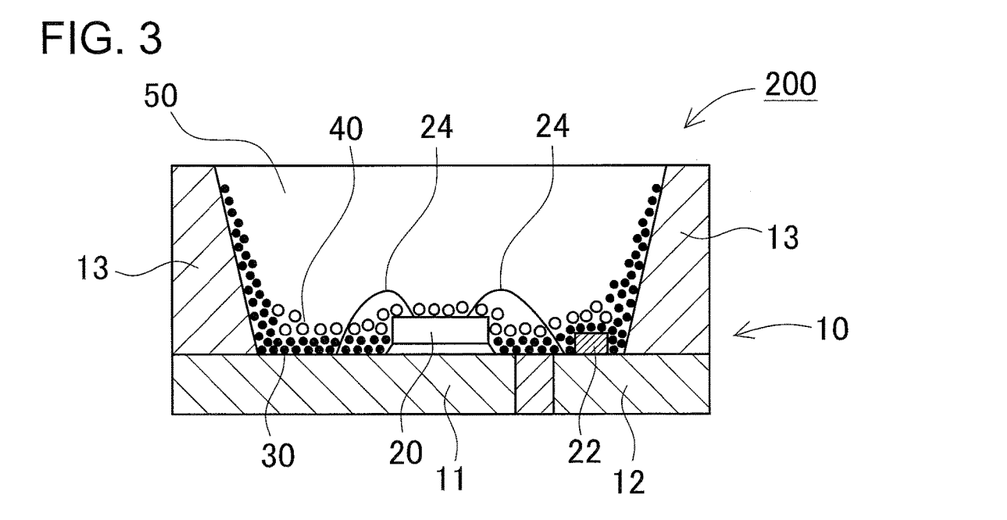
FIG. 3 is a schematic cross-sectional view of a light-emitting device according to a modified example.

Also, the reflecting elements 30 are arranged in the mounting area, on which the light-emitting element 20 is mounted, on the upper surface of the base 10. Herein, the reflecting elements 30 are arranged on a peripheral area that surrounds the light-emitting element 20. For a light-emitting device 200 according to a modified example illustrated in FIG. 3, the inclination surface of the lateral wall 13 can be at least partially covered in succession from the mounting area in the opening. In this manner, the reflectance on the lateral wall 13 in the opening is improved, thereby light extraction of the light-emitting device is more efficiency. As described later, in the light-emitting device including wavelength conversion member 40, the effect of color mixture of the light emitted by the light-emitting element 20 and the wavelength-converted light, of which the wavelength is converted with the wavelength conversion member 40, can be enhanced.

Wavelength Conversion Member 40

Furthermore, the light-emitting device can suitably include the wavelength conversion member 40 that convert the wavelength of the light emitted from the light-emitting element 20. Accordingly, the light-emitting device can output the mixed light which is mixture of light from the light emitting element 20 and light obtained by wavelength conversion using the wavelength conversion member 40. A Phosphor can be preferably utilized for the wavelength conversion member 40. Also, multiple types of phosphor can be mixed, as well as only one type of phosphor can be used. Materials known in the art can be applied for the phosphors, and for example, yttrium aluminum garnet (YAG) based phosphor, which is of the crystal having garnet structure that includes yttrium (Y) and aluminum (Al) and which are activated by cerium (Ce), or lutetium aluminum garnet (LAG) based phosphor is included. In particular, in the case of being used for a long period of time with high luminance, it is preferable to use a phosphor of $(Re_{1-x}Sm_x)_3(Al_{1-y}Ga_y)_5O_{12}$:Ce ($0 \leq x < 1$, $0 \leq y \leq 1$, however, Re is at least one type of element selected from a group made of Y, Gd, La, and Lu). Alternatively, nitride based phosphor or oxynitride based phosphor, which is mainly activated by lanthanoid based elements such as Eu and Ce, can be employed. The aforementioned materials are selected in such a manner that light from a light emission area has a desired color, in combination with the color of light emission of the light-emitting element. Examples of phosphor materials include YAG based phosphor or chlorosilicate based phosphor that emits green or yellow light, SCASN based phosphor such as $(Sr,Ca)AlSiN_3$:Eu, or a CASN based phosphor such as $CaAlSiN_3$:Eu to emit red light. Also, two types or more of phosphors may be mixed. Quantum dot phosphors may be employed. For example, the light-emitting device is configured to be capable of emitting white light by use of a blue LED as the light-emitting element and YAG phosphor that are excited by blue light to emit yellow light as the wavelength conversion member.

In the light-emitting device including the wavelength conversion member, it is required that the light from the light-emitting element is efficiently irradiated to the wavelength conversion member, and that uniform mixed color is obtained. Accordingly, the light from the light-emitting element 20 is diffusely reflected with the reflecting elements 30 and irradiated to the wavelength conversion member 40, thereby obtaining uniform light emission, so that the light emission in high quality, in which the color non-uniformity of the mixed light output form the light-emitting device is less likely to occur, can be obtained. The reflecting elements 30 are preferably arranged on the lower side of the wavelength conversion member 40, so that light from the light-emitting element 20 can be diffusely reflected efficiently and be incident on the wavelength conversion member 40. Also, it is preferable that the reflecting elements 30 be arranged in such a manner as to cover a lateral surface of the light emission area of the light-emitting element 20. This arrangement enables that the light emitted from the light emission area is diffusely reflected once with the reflecting elements 30 and is irradiated to the wavelength conversion member 40, so that the effect of suppressing color unevenness can be expected.

Also, part of the reflecting elements 30 is inserted between the wavelength conversion member 40, so that it can be expected that the effect of color mixture between the wavelength-converted light output from the wavelength conversion member 40 and the light of the light-emitting element 20 is enhanced. For example, in the case where the wavelength conversion member 40 is formed of a plurality of wavelength conversion particles, the average diameter of the wavelength conversion particles of reflecting elements 30 is reduced with respect to the average diameter of the wavelength conversion member particles 40, which makes it easy for the reflecting elements 30 to be inserted between the wavelength conversion member particles 40, thereby enhancing the effect of the color mixture. Although the average diameter of the particles of reflecting elements 30 depends on the average diameter of the wavelength conversion member particles 40, it is preferable that the average diameter of the particles of reflecting elements 30 be, for example, in a range of 1 µm to 20 µm. In contrast, the average diameter of the phosphor used as the wavelength conversion member particles 40 is in a range of about 5 µm to 40 µm.

It is preferable that the wavelength conversion member 40 is connected to the lead 11 via the reflecting elements 30 so that a heat dissipation path for the heat generated on the wavelength conversion member 40 can be made.

The wavelength conversion member 40 may be contained in the sealing member 50 and arranged in such a manner as to cover the light-emitting element 20. Also, the wavelength conversion member 40 may be settled or dispersed in the sealing member 50.

Second Embodiment

Also, the wavelength conversion member can be formed in a plate-shape, as well as in a state of the granular or powdered form. For a plate-shaped wavelength conversion member, the wavelength conversion member is formed in a desired shape in advance, and the wavelength conversion member can be arranged on the base. For example, in the case where wavelength conversion member is fixed with respect to the plurality of light-emitting elements, there is an advantage in that the wavelength conversion member can be fixed in the same step. Also, in the example shown in FIG. 1, the wavelength conversion member is arranged adjacent to and around of the light-emitting element 20, but the wavelength conversion member and the light-emitting element 20 can be separately arranged. The aforementioned example is illustrated in a cross-sectional view in FIG. 4 as a second embodiment. In a light-emitting device 300 illustrated in FIG. 4, the sealing member 50 that does not practically include the wavelength conversion member is arranged between the light-emitting element 20 and the wavelength conversion member 41, and the wavelength conversion member 41 is arranged on the sealing member 50. Also, the wavelength conversion member is away from the light-emitting element 20, thereby obtaining the effect that the wavelength conversion member 41 can be protected from heat generated by the light-emitting element 20.

Figure 4:
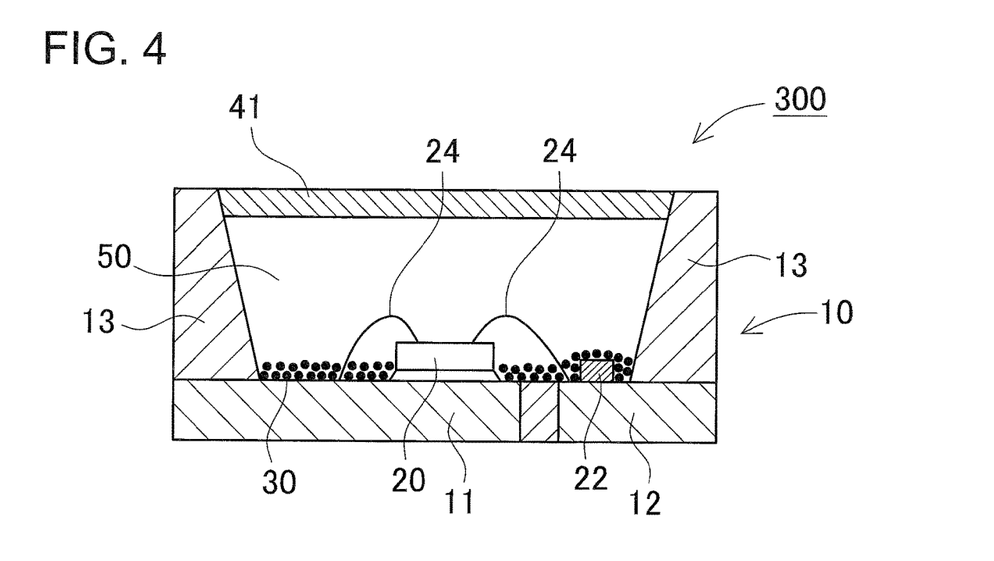
FIG. 4 is a schematic cross-sectional view of a light-emitting device according to a second embodiment of the present invention.

The plate-shaped wavelength conversion member 41 can be formed as the basic light transmissive member having a glass plate on which the wavelength conversion member is provided. The tabular wavelength conversion member 41 can be formed as a phosphor crystal, which is the wavelength conversion member, or a single crystal, a polycrystal, an amorphous body, and a ceramic body having the phase of the phosphor crystal. The plate-shaped wavelength conversion member 41 can be formed as a sintered body, an aggregate body, and a porous material of phosphor crystal particles, as a sintered body, an aggregate body, and a porous material of the phosphor crystal particles, to which light transmissive material is suitably added, or as a body in which the light transmissive material, for example, a light transmissive resin is mixed to or impregnated into the sintered body, the aggregate body, and the porous material. The plate-shaped wavelength conversion member 41 can be formed as the light transmissive member that contains phosphor particles, for example, a molded body made of the light transmissive resin. The light transmissive member is preferably formed of inorganic materials rather than organic materials in terms of heat resistance. Specifically, the light transmissive member is preferably made of the light transmissive inorganic materials that contain the phosphor, and in particular, the light transmissive member is made of a sintered body of the phosphor and the inorganic substance (i.e., binding agents or binders), or a sintered body or crystal made of the phosphor, and therefore reliability of the light emitting device is enhanced. In the case where YAG phosphor is used as the wavelength conversion member 41, the sintered body made of YAG/alumina in which alumina ($Al_2O_3$) serves as a binding material, or a sintered body in which glass serves as a binding material is preferably used in terms of reliability, as well as a single crystal of YAG or a highly pure sintered body. With the light transmissive member in the plate-like shape, good adherence efficiency is obtained between the main surface of the light transmissive member and the light emission surface of the light-emitting element constituted in a planar shape, so that the main surface of the light transmissive member can be easily positioned in such a manner as to be approximately in parallel to the light emission surface of the light-emitting element. Additionally, the thicknesses of the light transmissive members are approximately uniform, so that the amount of wavelength conversion of the light passing through the light transmissive members is approximately uniform, and a ratio of color mixture is stabilized, thereby color non-uniformity on the portion of the light emission surface is reduced. In terms of the efficiency of light emission and adjustment of chromaticity, the thicknesses of the wavelength conversion member 41 is preferably approximately 10 µm or more and approximately 500 µm or less, more preferably, approximately 30 µm or more and approximately 200 µm or less.

Third Embodiment

Figure 5:
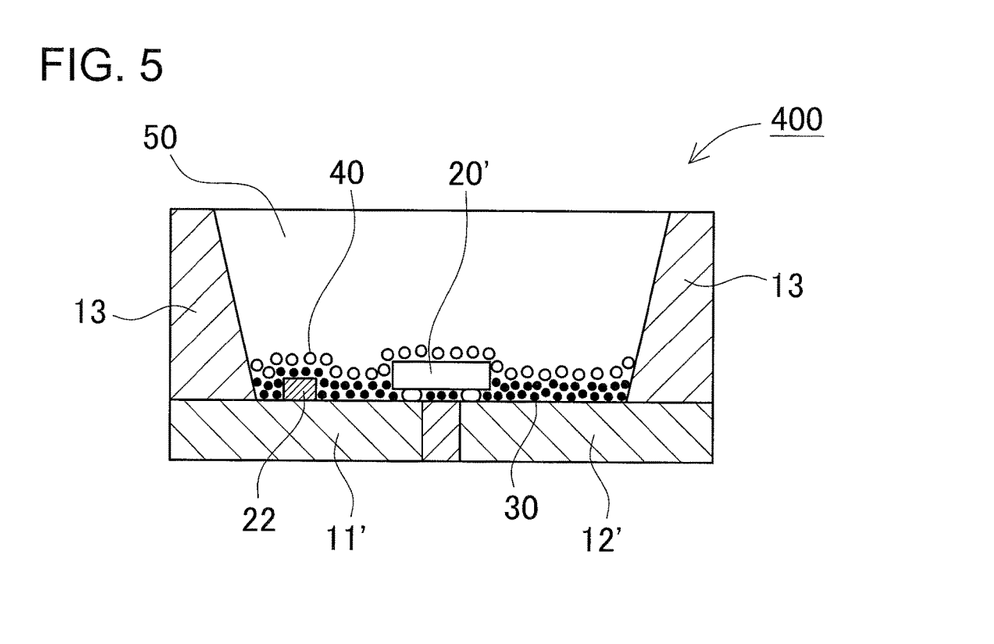
FIG. 5 is a schematic cross-sectional view of a light-emitting device according to a third embodiment of the present invention.

For a third embodiment, FIG. 5 shows an example of mounting method of light emitting element with a flip-chip mounting in a manner that an electrode-formed surface of the light-emitting element act as a lower surface thereof. In a light-emitting device 400, a light-emitting element 20' is bonded on one of leads in such a manner as to straddle a gap between the leads 11' and 12' (i.e., between an anode and a cathode) in a state where the end surfaces of the pair of leads 11' and 12' are separated from and opposing to each other. This structure does not require wire bonding. In this structure, the reflecting elements 30 are preferably arranged between the lower surface of the light-emitting element 20' and the mounting surface, so as to efficiently reflect the light output downward from the light-emitting element 20'. In this case, the light-emitting element 20' is mounted in a state where the reflecting elements 30 is arranged on a base in advance. Alternatively, after the light-emitting element 20' is mounted, the reflecting elements 30 are arranged in such a manner as to be arranged between the lower surface of the light-emitting element 20' and the mounting surface. Accordingly, a reflection function is exhibited by the reflecting elements 30 even on the lower surface of the light-emitting element 20', so that the light of the light-emitting element 20' can be efficiently utilized.

Fourth Embodiment

Figure 6:
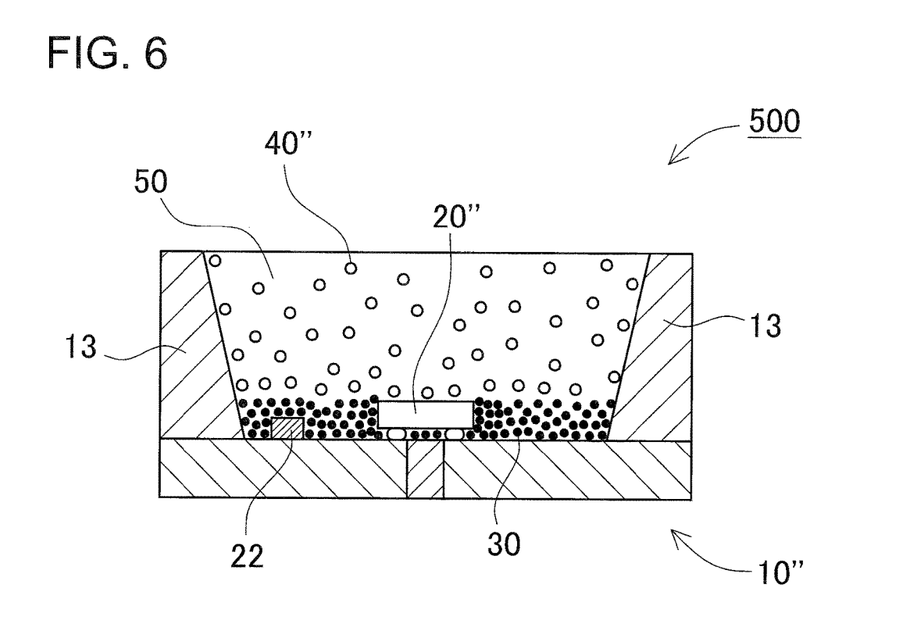
FIG. 6 is a schematic cross-sectional view of a light-emitting device according to a fourth embodiment of the present invention.

Herein, in a periphery of a light-emitting element, reflecting elements may be not only arranged in the vicinity of a bottom surface of the light-emitting element or below the light-emitting element, but also arranged in such a manner as to cover an entire lateral surface of the light-emitting element. Also, the reflecting elements may cover not only a lateral surface of the light-emitting element, but also be arranged in such a manner that the reflecting elements are filled up to approximately the same height as that of an upper surface of the light-emitting element, on the inner surface of the recessed portion of the base on which the light-emitting element is mounted. For the aforementioned example, a light-emitting device 500 according to a fourth embodiment is illustrated in a cross-sectional view in FIG. 6. In the light-emitting device illustrated in FIG. 6, reflecting elements 30" are provided in a space around a light-emitting element 20" mounted in the recessed portion of a base 10", and a wavelength conversion member 40" is further arranged on an upper surface thereon. Thus, the reflecting elements 30" are arranged on the approximately entire lateral surface of the light-emitting element 20", so that the light emitted by the light-emitting element 20" is securely reflected on the reflecting elements 30" and then supplied to the wavelength conversion member 40".

Manufacturing Method for Light-emitting Device

The manufacturing method for the light-emitting device will be described. First, the reflecting elements 30 are prepared in advance. Herein, the dielectric multilayer film 32 of which the thickness is set to reflect light of the light-emitting element 20 coats the surface of the core 31. The reflecting elements 30 obtained in the aforementioned manner are arranged in the mounting area on which the light-emitting element 20 is mounted, or arranged by applying resin in which the reflecting elements 30 are contained, thereby forming the reflection area. That is, the light-emitting element 20 is mounted in the opening of the base 10 in which the pair of leads is covered in advance, and the reflecting elements 30 are arranged on a desired portion of the base 10 and fixed with adhesive materials and the like. Furthermore, the wavelength conversion member 40 are arranged on the reflection area as needed. In this manner, the light-emitting device in which the reflection area is formed with the reflecting elements 30 can be obtained.

Thus, the dielectric multilayer film 32 is not directly formed in the mounting area, but the reflecting elements 30 where a plurality of the dielectric multilayer films 32 coat the core 31 are provided in advance, so that reflection structure in which the dielectric multilayer film 32 is employed can be easily formed. In particular, the reflection layer is formed of particles or powders of reflecting elements 30, and the reflection layer can be a shape to follow irregular surface. The reflection layer having high light reflection efficiency can be thereby formed even on convex and concave surfaces on which it is hard to directly form a DBR layer.

The aforementioned embodiments, examples, and modifications are merely exemplified for the purpose of embodying the technical concept disclosed in embodiments of the present invention, and the present invention is not limited to these. Also, in Description, members disclosed in Claims are not limited to the members of the embodiments. In particular, unless specifically stated otherwise, size, materials, shapes, and relative positions of constituent components described in the embodiments do not limit the scope of the present invention to the aforementioned descriptions only. There is a case where magnitudes, or positional relations of members illustrated in each drawing are exaggerated so as to clarify the descriptions. Furthermore, in the above descriptions, the same term or reference number represents the same or homogenous member, and therefore its detailed description is appropriately omitted. Furthermore, as for each element that constitutes an embodiment of the present invention, a mode may be such that a plurality of elements are constituted with the same member, and one member is used as the plurality of elements, or conversely, it may be achieved that the function of one member is shared by a plurality of members.

The light-emitting device according to the embodiments of the present invention can be preferably utilized for the light sources of backlights, light sources for lighting, headlights, projector devices, various display devices for advertisements or destination guide, displays in which light-emitting elements as light sources are arranged in a dot matrix, traffic lights, lighting switches, image reading devices such as digital video cameras, facsimile machines, copying machines, and scanners, various sensors such as image scanners, or various indicators.

Obviously, numerous modifications and variations of the present invention are possible in light of the above teachings. It is therefore to be understood that within the scope of the appended claims, the invention may be practiced otherwise than as specifically described herein.

What is claimed is:

1. A light-emitting device comprising:
a base;
a light-emitting element mounted on the base;
reflecting elements arranged around the light-emitting element to reflect light emitted by the light-emitting element, each of the reflecting elements comprising:
  a core; and
  a dielectric multilayer film which covers the core and which has a thickness to reflect a wavelength of the light emitted by the light-emitting element, the thickness of the dielectric multilayer film being approximately uniform; and
a wavelength conversion member arranged on the reflecting elements to convert the wavelength of the light emitted by the light-emitting element,
wherein the reflecting elements are arranged to cover at least a portion of a lateral surface of the light-emitting element,
wherein the reflecting elements are particles, and a part of the wavelength conversion member is provided between portions of the reflecting elements,
wherein the base includes an opening formed in a recessed shape in a cross-sectional view,
wherein the light-emitting element is mounted on a bottom surface of the opening, and the reflecting elements are arranged on a bottom surface of the base and around the light-emitting element,
wherein the base comprises a lateral wall surrounding the bottom surface of the opening,
wherein a portion of the lateral wall is covered with the reflecting elements,
wherein the lateral wall has an inner surface that is inclined, and
wherein the wavelength conversion member is arranged on the bottom surface and not on the lateral wall.

2. The light-emitting device according to claim 1,
wherein the reflecting elements are shaped like a film such that the reflecting elements cover a surface of the base which excludes an upper surface of the light-emitting element.

3. The light-emitting device according to claim 1,
wherein the core includes one selected from the group consisting of Cu, Ag, and Al.

4. The light-emitting device according to claim 1,
wherein the light-emitting element is mounted on the base in a flip-chip manner, and the reflecting elements are arranged between the base and the light-emitting element.

5. The light-emitting device according to claim 1,
wherein the base includes an electroconductive lead, and
wherein the light-emitting element is arranged on an upper surface of the lead.

6. The light-emitting device according to claim 1,
wherein the wavelength conversion member comprises wavelength conversion particles, and
wherein an average diameter of the particles of the reflecting elements is smaller than an average diameter of the wavelength conversion particles.

7. The light-emitting device according to claim 1,
wherein a protective element is covered by the reflecting elements, and
wherein the reflecting elements are particles, and part of the reflecting elements are provided between portions of the wavelength conversion member.

8. The light-emitting device according to claim 1,
wherein the average diameter of the particles of the reflecting elements is in a range of 1 μm to 10 μm.

9. The light-emitting device according to claim 1,
wherein the approximately uniform thickness of the dielectric multilayer film has a thickness distribution in a range of plus or minus 10 percent of an average value of the dielectric multilayer film.

10. The light-emitting device according to claim 1,
wherein the dielectric multilayer film is formed of at least two types or more of layers made of materials selected from a group consisting of, $SiO_2$, $TiO_2$, $Nb_2O_5$, $ZrO_2$, $Al_2O_3$, $Ta_2O_5$, $MgF_2$, AlN, SiON, and SiN.

11. The light-emitting device according to claim 1,
wherein the reflecting elements are arranged to cover both of lateral surfaces of the light-emitting element so as to form approximately uniform top surface of the reflecting elements and light-emitting element, and
wherein a wavelength conversion member is arranged on the reflecting elements and light-emitting element to convert the wavelength of the light emitted by the light-emitting element.

12. A light-emitting device comprising:
a base;
a light-emitting element mounted on the base;
reflecting elements arranged around the light-emitting element to reflect light emitted by the light-emitting element, each of the reflecting elements comprising:
a core; and
a dielectric multilayer film which covers the core and which has a thickness to reflect a wavelength of the light emitted by the light-emitting element, the thickness of the dielectric multilayer film being approximately uniform; and
a wavelength conversion member arranged on the reflecting elements to convert the wavelength of the light emitted by the light-emitting element,
wherein the reflecting elements are arranged to cover at least a portion of a lateral surface of the light-emitting element,
wherein the reflecting elements are particles, and a part of the wavelength conversion member is provided between portions of the reflecting elements,
wherein the base includes an opening formed in a recessed shape in a cross-sectional view,
wherein the light-emitting element is mounted on a bottom surface of the opening, and the reflecting elements are arranged on a bottom surface of the base and around the light-emitting element,
wherein the base comprises a lateral wall surrounding the bottom surface of the opening,
wherein a portion of the lateral wall is covered with the reflecting elements, and
wherein the wavelength conversion member is arranged on the bottom surface and not on the lateral wall.

\* \* \* \* \*